United States Patent [19]

Reuschel et al.

[11] 4,012,217
[45] Mar. 15, 1977

[54] BENDING SILICON RODS INTO U-SHAPES

[75] Inventors: Konrad Reuschel, Vaterstetten; Ulrich Rucha; Gerhard Schrotter, both of Munich, all of Germany

[73] Assignee: Siemens Aktiengesellschaft, Berlin & Munich, Germany

[22] Filed: Nov. 7, 1975

[21] Appl. No.: 629,916

[30] Foreign Application Priority Data

Nov. 18, 1974 Germany .......................... 2454592

[52] U.S. Cl. ..................................... 65/102; 65/108; 156/614

[51] Int. Cl.$^2$ ......................................... C03B 23/06

[58] Field of Search ............ 65/102, 103, 104, 105, 65/108, 110, 271, 272; 156/613, 614, DIG. 64

[56] References Cited

UNITED STATES PATENTS

| | | | |
|---|---|---|---|
| 2,485,979 | 10/1949 | McCandless et al. | ........... 65/102 X |
| 3,186,820 | 6/1965 | Adkins | ............................. 65/271 |

*Primary Examiner*—Arthur D. Kellogg
*Attorney, Agent, or Firm*—Hill, Gross, Simpson, Van Santen, Steadman, Chiara & Simpson

[57] ABSTRACT

A U-shaped carrier member formed out of a bent silicon starting rod which is uniformly heatable by means of electric current and which is substantially neither elongated nor contracted relative to the starting rod. A process for the preparation of such carrier member is provided.

16 Claims, 2 Drawing Figures

BENDING SILICON RODS INTO U-SHAPES

BACKGROUND OF THE INVENTION

By prior art teachings, silicon is deposited upon the surfaces of U-shaped carrier members made to silicon. Such a carrier member is mounted upright in the interior of a reaction vessel which can consist of a base plate fitted with a gas-tight bell thereover. An electrode is connected to each free end of the carrier member and such is heated by way of an electric current supplied via the electrodes. A reaction gas flows through the reaction container. Silicon separates from this atmosphere and deposits upon surfaces of the carrier member.

The carrier member may consist of one piece, since it is known in the art that silicon may be plastically deformed as soon as it is sufficiently hot, but the danger exists that a one piece carrier member at its bent locations will heat up during the deposition operation to an essentially different temperature than at its straight locations, so that an uneven growth of deposited silicon on surfaces thereof will result. For this reason, the U-shaped carrier member has been commonly made, in the past, of two equally sized parallel rods having a connection bridge across the upper ends of such two rods, such bridge consisting of a further silicon rod. While it is true, that this arrangement will provide centrifications will respect to reproduction of the desired carrier members, this arrangement can result in the presence of additional impurities which are undesirable when a good conductive connection is desired to start with between individual elements of such an arrangement. Furthermore, if one does not want to weld together the individual components of such a multi-element U-shaped carrier, mechanical oscillations of the bridge, and even a possible loss of the bridge, must be anticipated under subsequent use conditions since ponderomotive forces may occur due to the alternating currents applied as heating means.

BRIEF SUMMARY OF THE INVENTION

More particularly, the present invention is directed to a technique for bending silicon rods. The starting rods are generally straight and have a transverse thickness ranging from about 3 to 50 mm and further have a homogeneous cross section. The starting rods are preferably stretched.

The starting rods are bent into U-shaped carrier members. Such members are adapted for further treatment in a reaction vessel or zone of the type suitable for vapor phase deposition of silicon thereon. Such a vessel characteristically is provided with a base plate. Such a reaction vessel as characterized above provided with a base plate having a pair of electrodes mounted therein which electrodes are adapted for connection to the free ends of such U-shaped carrier members with the carrier member in an upright position so that an electric current supplied via the electrodes is adapted to heat the carrier member.

A principle object of the present invention is to provide a technique for producing from straight silicon starting rods single piece U-shaped carrier members which are uniformly heatable by means of electric current as in a process for depositing uniformly vapour phase deposition of silicon heated surfaces.

Another object is to provide in a method for depositing silicon on the surfaces of a U-shaped carrier member a procedure for making single piece U-shaped carrier members.

It is another object of this invention to provide a bending technique for silicon rods in which the rod is not substantially increased or decreased in length during bending, particularly as regards what can be termed a neutral zone in the rod.

Other and further aims, objects, purposes, advantages, features, and the like will be apparent to those skilled in the art from the present specification taken with the accompanying drawings.

DETAILED DESCRIPTION

Bending of a straight silicon starting rod as provided by the teachings of the present invention does not appreciably change the size of the cross sectional area although it does typically change the shape of the section at the bent places as compared with the cross section conditions prevailing in the straight starting rod so that electric resistance of the bent rod or product U-shaped carrier member, which is related to the unit length will remain substantially homogeneous and uniform. As those skilled in the art will appreciate a straight silicon starting rod of some appropriate length can be bent into a plurality of different U-shapes, or hair-pin shapes. Since, however, the apparatus wherein a product U-shaped carrier member of this invention is to be inserted is typically predetermined with respect to the spacing of the electrodes therein located at the base plate of the reaction thereof, which electrodes typically hold the U-shaped carrier member, a defined bending is typically required in forming a given U-shaped carrier member from a starting rod.

Figure 1:
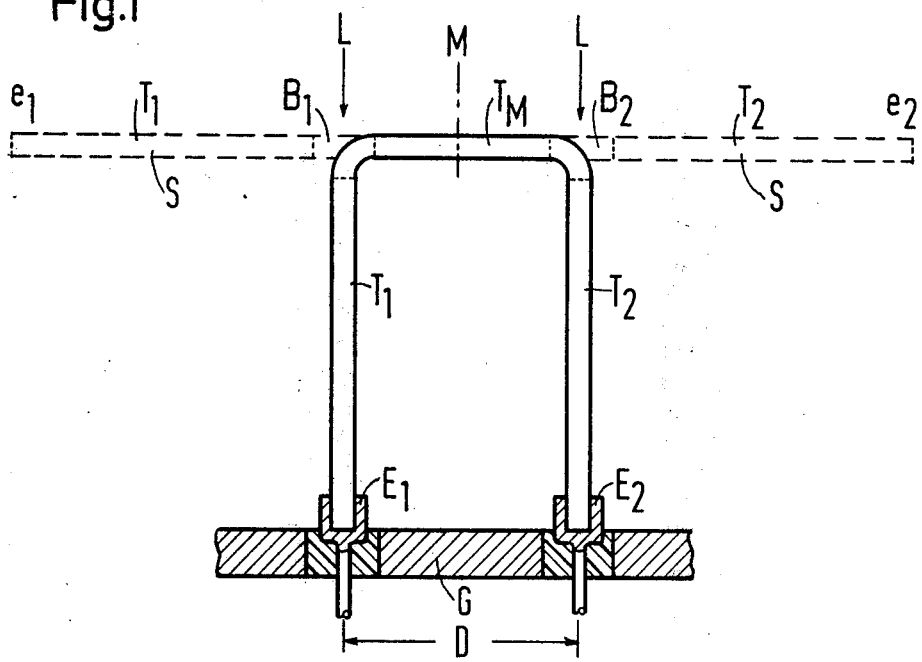
FIG. 1 is a diagrammatic view in side elevation with some parts thereof shown in section and some parts thereof broken away of a device for depositing silicon upon the surface of a U-shaped carrier member made of silicon illustrating how such U-shaped carrier member is formed from a single straight starting rod of silicon.

Referring to FIG. 1, there is seen a U-shaped carrier member produced by locally placing a stretched thin silicon rod of homogeneous cross-section and sufficient length into a plastic state in a narrow zone $B_1$ and $B_2$ free on each side of the rod center M. Each zone includes neither the center M nor the respective rod ends $e_1$ or $e_2$. A plastic state is achieved by heating such zones to at least about 1100° C. The distance each plastic zone $B_1$ and $B_2$, is spaced from the rod center M is approximately half the spacing D between the electrodes $e_1$ and $e_2$, which will later mount free ends of the U-shaped carrier. The rod is bent by the use of bending forces located only at the solid rod portions $T_1$ and $T_M$, or $T_2$ and $T_M$, respectively, which form the boundaries of each plastic zone $B_1$ and $B_2$. The bent rod is then cooled in such a way that two parallel legs $T_1$ and $T_2$ protrude perpendicularly from a straight center piece $T_m$, the length of $T_m$ being equal approximately to the distance D between the two electrodes $E_1$ and $E_2$.

The U-shaped carrier member obtained in this way, as shown in FIG. 1, is composed of three parts of the original silicon rod S which has not been bent, namely, the two legs $T_1$ and $T_2$ as well as the center piece $T_M$. Of the device employed for depositing silicon upon the surface of a U-shaped silicon carrier member, only parts of a base plate G and the two individually electrically insulated electrodes $E_1$ and $E_2$, which are anchored in the base plate G, are shown. The bending zones of $B_1$ and $B_2$ and short in longitudinal rod length so that the product U-shaped carrier member is relatively very strongly bent in such zones.

In heating a zone, such as zone $B_1$ or $B_2$, it is preferred to employ an energy source having a relatively high-energy distributed over a relatively narrow range. Heretofore, a gas burner producing a narrow but hot flame (for example, an oxygen-acetylene flame, an oxygen-natural gas flame, an oxygen-hydrogen flame, or the like) can be used which heats a starting silicon rod greatly at a zone which is to be bent. The use of a laser with a corresponding beam of focused radiation is particularly favorable, as is the use of an electron beam. If the heating is effected using oxidizing gasses, an increased oxidation layer must be anticipated upon the surfaces of the bent positions of the finished U-shaped silicon carrier member, so that the current-carrying cross-section thereof is then somewhat decreased at the bent locations of the carrier, as compared with its straight locations causing the undesired temperature differential therein. However, the difference in cross section is small, and can be balanced substantially even by merely controlling the silicon vapor phase deposition process using such a U-shaped carrier rod so that the vapor phase silicon deposition process proceeds in such a way that the adjusted operational conditions place a U-shaped silicon carrier member into the falling point of the temperature-deposition-speed curve. It is also possible to heat a rod with the help of high frequency alternating electric current applied across a zone to be heated and bent. Furthermore, an indirect radiation heater, such as a graphite heater, may be employed for zone heating.

A cross-sectional decrease or increase in area is always experienced when a rod is longitudinally extended or contracted during a bending process. Longitudinal dimensional change is always coincident with a change in length of the so-called "neutral fiber" or "neutral zone" in and such a dimensional change, by the teachings of this invention can be avoided when the bending forces remain directioned perpendicular to the axis of the rod which is to be bent. It is desired to control the bending process so that such bending forces are achieved and so that occurrence of significant temperature differences between the straight and bent portions of the U-shaped carrier is not required.

While one zone of heating and bending could be used, it is preferred to use two such zones in making a U-shaped carrier member. Furthermore, it is preferred to render the longitudinal length of each of two zones, at least equal to about the diameter of the rod which is to be bent, and not more than about three times the value of this diameter, since such lengths will permit optimized control of rod bending by this invention. The angle of bending usually experienced by a given location or zone can extend up to an angle of 90° upon a very short radius of bending. In one preferred mode, the angle of bending is about 90° at each zone.

The temperature at a bending location or zone should be at least about 1100° C, but, should not exceed the melting temperature of the silicon in such zone so that a local melting could occur. In order to obtain the longitudinally short regions of plasticity desired in a zone which is to be bent, a steep temperature profile is preferably produced along the rod. Thus, it is preferred to employ as a heat source one which has as narrow a zone of heat (in width thereof) as possible and to locate this zone of heat in the center of a zone of a rod to be heated and then bent. Thus, a narrow, but relatively very hot gas flame, such as a hydrogen-oxygen flame, an oxygen-acetylene flame, or the like, is preferred as a heat source. The use of a focused radiation source with a high radiation density, especially a laser or an electron-beam source, is even more advantageous, whereby the radiation from such a source is focused onto a small range in the center of a rod zone which is to be rendered plastic.

It is furthermore preferred in the interest of achieving a great temperature gradient, that the silicon rod undergoing zone heating is, in addition, cooled during such heating process at places thereof which are not to be rendered plastic particularly those places which may be affected by the use of a heat transfer device which is applied on either side longitudinally of the rod zone being heated the means used to apply bending force to a heated rod can be internally cooled. Thus, the workpiece mountings of a bending machine may be internally cooled.

The rod which is to be bent preferably comprises either a single crystal of silicon or polycrystalline silicon. A monocrystalline silicon rod, however, can characteristically be deformed somewhat more easily. Furthermore, as can be easily seen, it is usually preferable to use a starting rod, which is to be bent having a diameter of not more than about 10 mm, since rods thinner than this can be bent more quickly and more easily than rods thicker than this. In order to exceed the rate of solidification after heat removal from a plasticized zone, it is recommended that the bending be accomplished with an angular speed of at least about 3°/sec.

Figure 2:
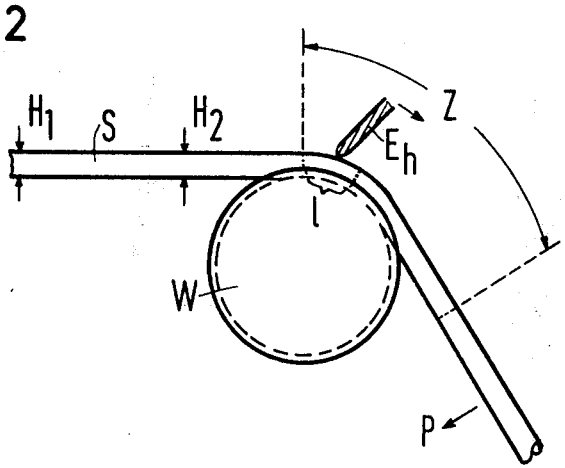
FIG. 2 diagrammatically illustrates one embodiment of preferred technique for forming a bend in a straight silicon rod in making a U-shaped carrier member of the type shown, for example, in FIG. 1.

In the case of the above-described FIG. 1 exemplary embodiment, the initial rod is rendered into a plastic state only at each of the two zones which are symmetrically arranged with respect to the rod center by way of a heating procedure such as above described and the heated, plasticized zones are bent while being in such plastic state, so that the two lens of the carrier are connected via a straight bridge (i.e., a bridge which is not bent). A method for the production of a U-shaped carrier member whereby a preliminarily stretched rod, in particular, a single-crystal silicon rod, is rendered at one point into a plastic state in the zone, which is to be bent by way of heating to at least about 1100° C then is bent by bending forces P, without extension or contraction of the length of the rods' neutral zone, whereby these forces are exclusively applied to the non-plastic portions of the rod, adjacent such plastic zone, on both longitudinal sides thereof, and finally is cooled, as illustrated in FIG. 2.

Thus an initially substantially straight preferably stretched silicon rod S is placed circumferentially adjacent a cylindrical bending template at a first radial contact position $b_1$. This template has a circumferentially extending groove defined therein which extends from such first contact position. Such first contact position is at the edge of a predetermined section or zone Z of the rod S to be bent through an angle which is here 90°. The rod S is heated with a zone of heat substantially only at said first contact position $b_1$ to a temperature which is at least about 1100° C and which temperature is sufficient to place said rod in a plastic state. Bending forces are applied to said so heated rod adjacent to, and longitudinally spaced on each side of, said so heated first contact position $b_1$. The rod is bent at such first contact position with said forces until a region thereof adjacent said first contact position comes into face-to-face engagement with circumferentially adjacent portions of said groove. Then the rod is cooled at said first contact position to a solid state.

The zone of heat is moved longitudinally relative to the rod S in a direction away from such zone edge along said zone to a second radial contact position between said groove and said rod. The bending forces, are similarly moved. The sequence of steps involving successive heating and bending of adjacent positions is repeated until said section or zone has substantially completely conformed to surface portions of the groove in the template and the rod has been bent as desired.

The process steps of heating, applying bending forces and bending can be and preferably are simultaneously and continuously practiced. The process steps of moving the zone of heat and the bending forces can be and preferably are sequentially and continuously practiced. The heating by proceeding from the position $b_1$ of the first contact between the silicon rod S and templet W may be effected in such a way that always only a very small partial zone Z of the entire zone Z which is to be bent, is brought into the plastic state and is then bent, the plastic state is again reversed before the next adjacent partial zone is treated in the same manner, and the method of the piece-by-piece heating and deformation is carried out until finally the entire part of the silicon rod, which is to be deformed, has the desired bent shape. The heating for this reason may, for instance, be effected by way of supplying heat via the templet W.

As can be seen from FIG. 2, a heating can be achieved, for instance, by applying sufficient electric voltage for a quick local heating of the rod S at the contact point between a templet W embodied as an electrode made of heat-resistant, inert and electrically conductive material and an opposite electrode $E_h$ contacting preferably the outside of the rod S which is to be bent, at another place but in the proximity of the location of a contact position where heating and bending occur. The opposite electrode $E_h$ may, for example be shiftable along the rod longitudinally without exerting substantially any pressure on it, so that a heating of the rod can be limited only to those positions thereof which are to be plasticized and bent.

Alternatively, a heating can be effected via a gas flame applied to the rod at the position of the electrode $E_h$.

Alternatively, the roller W can be employed as a heat source, in such a way that it is preliminarily heated before at the beginning of a bending operation to a sufficiently high temperature, i.e., a temperature above about 1100° C.

Alternatively a heating can be achieved by the use of a focused radiation source, such as one which is mentioned above, in particular a laser. A cooling of the rod portions adjacent to the bending zone, for instance, via the mountings thereof may be advantageously effected.

Since the methods of this invention are practiced in such a way that the distance between the ends of a U-shaped carrier member approximately equals the spacing between the electrodes in a deposition chamber, one can, perhaps after shaping each end of a U-shaped carrier member into a tapered configuration mount such carrier directly into the electrodes in a manner such as shown in FIG. 1. The deposition apparatus can then be operated in the usual and known manner. Thus, a single-piece U-shaped carrier member prepared as herein described is first preferably contacted with hydrofluoric acid or a similar treating liquid in the interest of providing a high degree electric contact between the opposed ends thereof and the electrodes $E_1$ and $E_2$. After being functionally positioned in the treating chamber, and the reaction container has been closed and provided with an inert gas or hydrogen, an electric current supplied via the electrodes $E_1$ and $E_2$ sufficient to heat the U-shaped carrier to a temperature ranging from about 1300° to 1400° C in order to remove the oxidation layer from its surfaces by way of evaporation of silicon monoxide, or by way of reduction. Then, the reaction gas which is to be used as a source for the vapor phase deposition of silicon is upon the U-shaped member is introduced into the reaction chamber and used for contacting the carrier members surfaces which are now possibly heated to a lesser temperature (for instance, about 1100° to 1250° C). In most cases, a monocrystalline silicon deposition will not be desired even if the U-shaped carrier has been produced by way of bending a single-crystal rod, since a single-crystal formation is subsequently possible within a short time by way of a suitable conventional zone melting process, as those skilled in the art will appreciate. An even surface temperature of the U-shaped member is achieved due to the even cross-sectional surface, and thus uniform layer thicknesses of the silicon upon the entire surface of the U-shaped carrier is obtained.

For converting U-shaped, coated carrier members into a single-crystal state by way of zone melting, only the straight portions of the carrier are advantageously mounted in the zone-melting apparatus. The bent portions are melted in a crucible melting apparatus in order to be able to draw renewed straight thin silicon rods from the molten silicon, in accordance with Czochralski, which then again can be further processed to form U-shaped carriers. A main advantage of employing U-shaped carrier members is that the straight portions of such a carrier once coated with silicon can be utilized in their full length which, for example is not possible when an in-homogeneously composed composed U-shaped carrier member has been coated with silicon.

Particularly in the case where relatively high temperatures are to be employed in plasticizing (heating) at the bending point, it may be advantageous to maintain the heated portions of a rod being bent in an inert or reducing atmosphere. Such an atmosphere can be achieved by using an inert gas current in the vicinity of the heating which gas can be preheated and is fed to such vicinity from a nozzle directed at such vicinity. The bending process of this invention may be effected by using a bending machine holding a rod on both sides longitudinally of the plastic zone and carrying out a defined bending moment. It is preferred as indicated before, that the rod be cooled during a bending operation at positions thereof which are not being heated and bent.

We claim:
1. In a method for depositing silicon on surfaces of a U-shaped carrier member comprised of silicon, involving the steps of

A. mounting a U-shaped carrier member rod by its free ends in an upright position in a treating zone, each such free end contacting a different electrode member for passage of an electric current therethrough, and B. heating the so mounted rod by an electric current passed therethrough while simultaneously flowing a reaction gas through said treating zone to deposit uniformly silicon on surface portions of said so mounted rod, the improvement which comprises bending at predetermined zones heated to plasticity into a U-shaped configuration an initially substantially straight, elongated silicon starting rod having a transverse thickness ranging from about 3 to 50 mm and a homogeneous cross section without substantially lengthening or shortening said rod, said bending is accomplished by the steps of A. heating said starting rod at locations thereof which are to be bent to form said U-shaped configuration to a temperature from about 1100° to 1400° C and which is sufficient to place such locations in a plastic state, B. applying bending forces to said so heated rod adjacent to, and on each side of, said locations, C. bending with said forces at said locations said so heated rod into a predetermined, desired U-shaped configuration, and D. cooling the resulting rod at said locations to a solid state.

2. The method of claim 1 wherein said starting rod is monocrystalline.

3. The method of claim 1 wherein said starting rod is polycrystalline.

4. The method of claim 1 wherein said starting rod is so heated at two locations, each one of said locations being on a different side of the center of said rod and about equally distant therefrom, the spacing between said locations being about equal to the spacing between said electrode members said bending being carried out substantially without compressing or stretching neutral fibers of said rod.

5. The method of claim 4 wherein said starting rod is successively and separately so heated, applied with bending forces, bent, and cooled at each of said two locations.

6. The method of claim 4 wherein said starting rod is so heated with a laser radiator whose energy is concentrated in the central zone of each one of said locations.

7. The method of claim 1 wherein, at one of said locations, said starting rod is placed circumferentially against a cylindrical bending template at a first contact position perpendicular to the axis of said template, said first contact position being in a circumferentially extending guide groove in said template, said rod is heated at least on the side of said first contact position opposed to said template, said rod has applied thereto on said one side a bending force, and said rod is bent with said force.

8. The method of claim 7 wherein at said one location said starting rod is sequentially bent into a desired configuration which conforms to a predetermined circumferential surface portion of said template in said guide groove thereof.

9. A method for bending an initially substantially straight rod comprised of silicon comprising the steps of:

A. placing circumferentially said starting rod adjacent a cylindrical bending template at a first radial contact position, said template having a circumferentially extending groove defined therein and extending from said first contact position, said first contact position being at the edge of a predetermined section of said rod to be bent, B. heating said rod with a zone of heat substantially only at said first contact position to a temperature from about 1100° to 1400° C and which is sufficient to place said rod in a plastic state, C. applying bending forces to said so heated rod adjacent to, and longitudinally spaced on each side of, said so heated first contact position, D. bending with said faces at said first contact position said rod until a region thereof adjacent said first contact position comes into face-to-face engagement with circumferentially adjacent portions of said groove in said section, E. cooling said rod at said first contact position to a solid state, F. moving longitudinally relative to said rod in a direction away from said edge along said section to a second radical contact position between said groove and said rod said zone of heat and said bending forces, and G. repeating the sequence of steps (B) through (G) until said section substantially completely conforms to surface portions of said groove.

10. The process of claim 9 wherein steps (B), (C) and (D) are simultaneously and continuously practiced, and steps (E) and (F) are sequentially and continuously practiced.

11. The process of claim 10 wherein said zone of heat is said template.

12. The process of claim 9 wherein said zone of heat provided at least in part by an electric current flowing between said template as one electrode and a second electrode, said second electrode being located adjacent said rod on the side thereof opposed to that contacting said template, said second electrode being adjustable longitudinally along said rod in said section.

13. The process of claim 9 wherein said zone of heat is a laser.

14. The process of claim 9 wherein said rod at least in said heated contact positions is maintained in a reducing gas atmosphere.

15. The process of claim 9 wherein said moving is carried out at a generally constant rate.

16. The process of claim 9 wherein said rod is additionally cooled in regions thereof outside of said contact positions.

* * * * *